United States Patent [19]

Golden et al.

[11] Patent Number: 5,196,789
[45] Date of Patent: Mar. 23, 1993

[54] COAXIAL SPRING CONTACT PROBE

[76] Inventors: Joseph R. Golden, 10290 S. Foothill Blvd., Cupertino, Calif. 95014; Brian T. Bernard, 13337 Pierce Rd., Saratoga, Calif. 95070

[21] Appl. No.: 646,267
[22] Filed: Jan. 28, 1991
[51] Int. Cl.$^5$ .................. G01R 31/02; G01R 15/12
[52] U.S. Cl. ..................... 324/158 P; 324/72.5; 439/482
[58] Field of Search ............ 324/158 F, 158 P, 72.5; 439/482, 824

[56]  References Cited
U.S. PATENT DOCUMENTS

| | | | |
|---|---|---|---|
| 4,016,492 | 4/1977 | Miler, Jr. et al. | 324/158 P |
| 4,138,643 | 2/1979 | Beck et al. | 324/72.5 |
| 4,659,987 | 4/1987 | Coe et al. | 324/158 P |
| 4,908,576 | 3/1990 | Jackson | 324/158 P |
| 4,978,907 | 12/1990 | Smith | 324/72.5 |
| 5,004,977 | 4/1991 | Kazama | 324/72.5 |

*Primary Examiner*—Vinh Nguyen

[57]   ABSTRACT

An improved spring loaded contact probe for testing printed circuit boards, electronic components, and substrates includes a center conductor, or wire, at least one outer layer of dielectric material surrounding the wire, a conductive layer surrounding the conductive layer, and a dielectric material surrounding the conductive layer, all in turn surrounded by a non-conductive bushing slidably mounted within a conductive tube and loaded by a compression spring with respect to the tube. One end of the tube has an end cap that contains and holds in place the compression spring. At the end of the center conductor, extending from the tube end opposite to the cap end, a conductive contact head is attached to center conductor, makes for making physical and electrical contact with the electronic component. In this way, electrical signals for test purposes can be applied to the center wire, and the conductive layer of the coaxial spring can be grounded through a suitable grounding lead, thereby preventing cross talk between other adjacent spring contact probes while still allowing the probes to be matched in impedance with the coaxial cable of the electrical tester, and to operate at higher frequencies.

10 Claims, 4 Drawing Sheets

COAXIAL SPRING CONTACT PROBE

BACKGROUND

1. Field of Invention

This invention relates to improvement in the testing of printed circuit boards electronic components substrates, and other application where circuit access requires a mechanically compliant electrical contact system.

BACKGROUND

2. Description of the Prior Art

Until this invention all spring contact probes consisted mainly of a hollow tubular body that contains the contact plunger plus the compression spring. The spring contact probes are normally mounted in an electrically insulated block and the pattern of the probes so arranged to agree with the part that is to be electrically tested. The other end of the spring contact probe is electrically interfaced to a tester. The block with the probes are mounted to a mechanism that moves the block in a controlled up/down motion. When the probes make contact with the part under test the contact plunger is depress up into the body. The spring acting against the contact plunger causes the contact plunger to apply pressure against the part under test. The path of the electrical signal through the spring contact probe is through the contact plunger which is in contact with the part under test, through the body of the spring contact probe, and finally through an electrical wire that is connected to the spring contact probe with the other end of the wire terminated to an electrical tester.

As parts begin to operate at higher frequency the need to control the electrical path from the tester to the part under test becomes more critical. Testers are now designed around a controlled impedance using coaxial cables to prevent signal degradation. The crosstalk that exist between spring contact probes and the mismatch impedance between spring contact probes and the tester, creates a need for improvement to avoid problems of mismatch impedance between spring contact probes and the tester, and crosstalk between adjacent spring contact probes. The present invention satisfies the aforesaid need.

PRIOR ART DISCLOSURES

Disclosures in the field of spring contact probes include the following U.S. patents.

| | |
|---|---|
| 4,801,876 | 4,200,351 |
| 4,659,987 | 4,138,643 |
| 4,658,212 | 4,050,762 |
| 4,321,532 | 4,676,776 |

SUMMARY OF THE INVENTION

Figure 1:
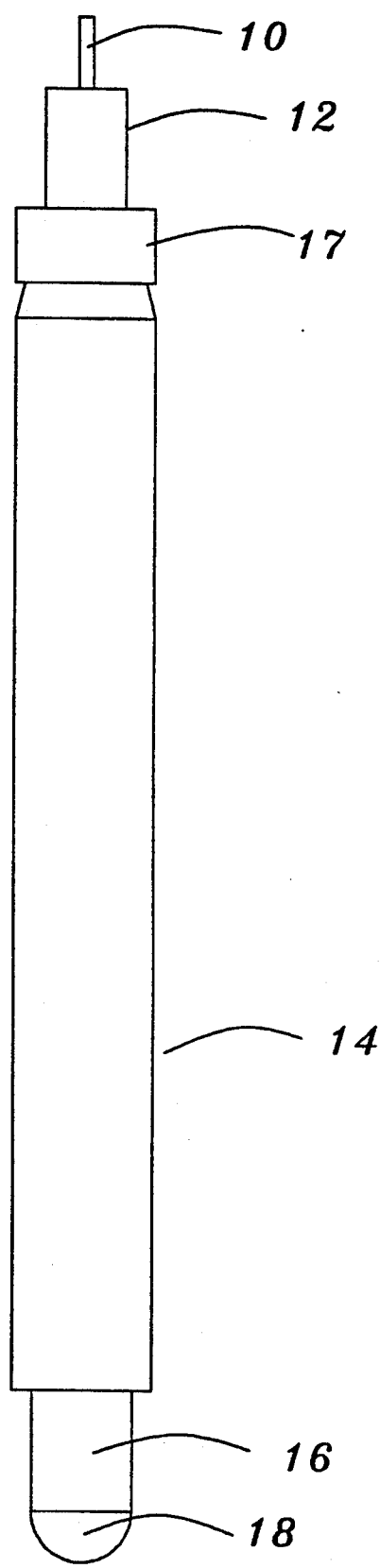
FIG. 1 a vertical elevational view of a coaxial spring contact probe.
Figure 2:
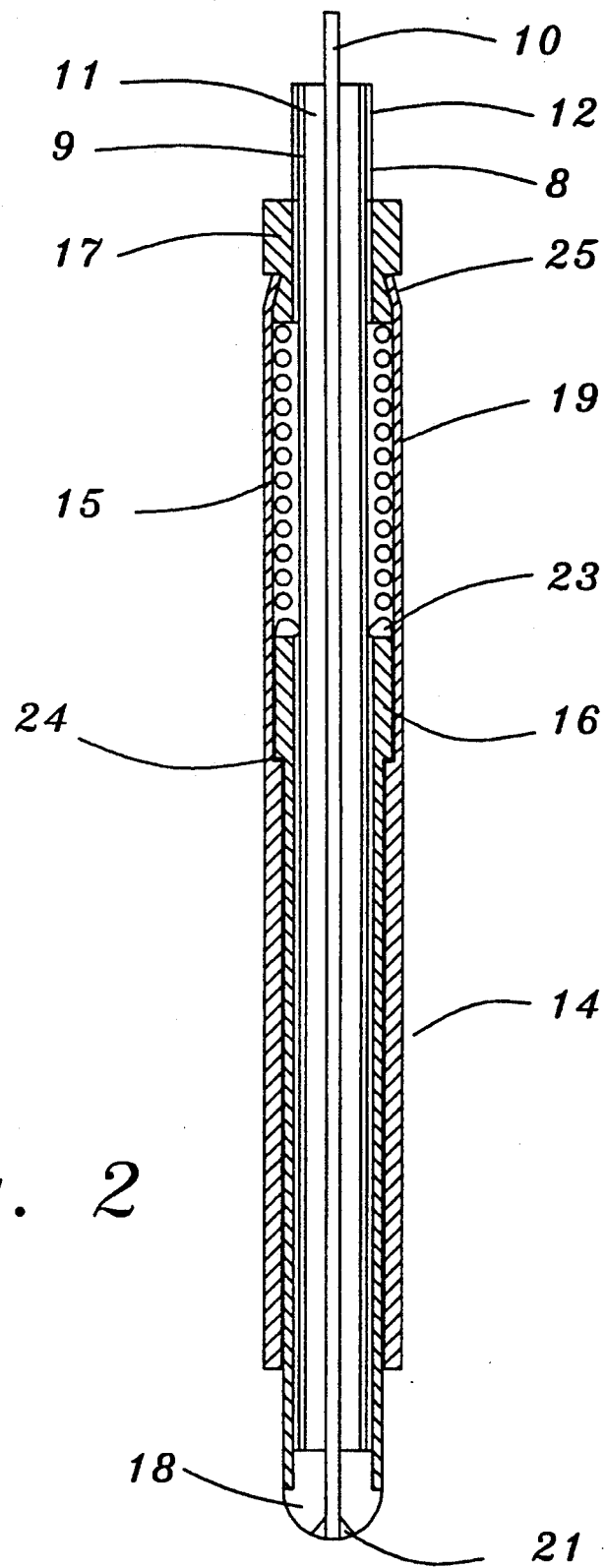
FIG. 2 is a cross-sectional view of a coaxial spring contact probe..

The primary object of the present invention is to provide an improved spring contact probe for testing electronic components.

The spring contact probe is coaxial in construction provides a controlled electrical environment matches impedance to the coaxial cable of the tester eliminates crosstalk between adjacent spring contact probes and is able to operate at higher frequencies. This will result in substantially improve product yield.

The present invention is directed to an improved spring contact probe. The coaxial cable is contained within a hollow tubular body. At one end of the coaxial cable a conductive contact point is attached to the center wire of the coaxial cable while the other end of the cable terminates to a coaxial connector which then ties into the tester coaxial cable. A compression spring and a non-conductive bushing surrounds the coaxial cable and are contained within the hollow tubular body. An end cap is placed at one end of the tubular body to contain and hold in place the compression spring while the other end of the compression spring is contained by the bushing. When the contact point makes contact with the part under test the compression spring collapses thereby causing the contact point to exert pressure on the part that is being tested.

Other objects of the invention will become apparent as the following specification progresses, reference being made to the accompanying drawing for an illustration of the invention.

DETAILED DESCRIPTION OF THE PREFERRED EMBODIMENTS

The coaxial spring contact probe of the present invention is broadly denoted by the numeral 14 and is illustrated in FIG. 1–4. Probe 14 in one embodiment of FIG. 1, 2 and 3 includes a coaxial cable 12. The central wire 10 is a conductor and can be made of any suitable electrically conductive material such as copper. A dielectric layer 11 surrounds wire 10. The dielectric is a non-conductive material such as teflon polyvinyl chloride, or polyethylene. An electrical conductive layer 9 surrounds and contains the dielectric. The conductive layer can be a braided copper sleeve or a conductive coated plastic. The final layer 8 is an insulated layer surrounding the conductive layer. The insulating layer can be made of any suitable non-conductive material such as teflon, polyvinyl chloride, or polyethylene.

Coaxial cable 12 which is made up of central wire 10, dielectric layer 11, conductive layer 9, and insulating layer 8 and are all concentric with each other. Elements 10, 11 and 9 extend the full length of coaxial spring contact probe 14. Insulating layer 8 is removed from the coaxial cable 12 at some point within the length of the tube 19 to allow electrical contact to be established. The diameter of coaxial cable 12 can carry in size depending upon the requirement of impedance desired, the spacing distance between probes as shown in FIG. 4, and spacing of test points of the electronic device.

At one end of probe 14 the wire 10 terminates in contact point 18. At the other end of probe 14 the coaxial cable 12 can extend to any desired distance. Contact point 18 is made of a conductive material such as brass. The central wire 10 of coaxial cable 12 extends the full length of contact point 18 and is fastened at one end by solder 21. Solder 23 fastens the compression spring 15 to conductive layer 9. This allows grounding of conductive layer 9 to outer tube 19 through compression spring 15.

Figure 3:
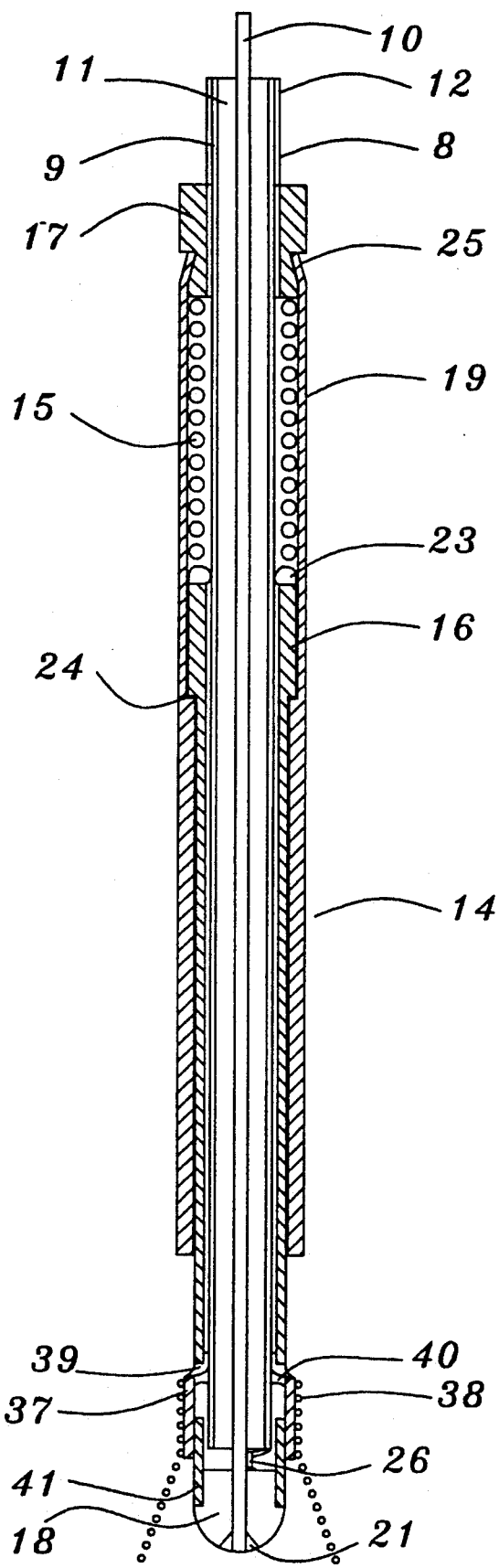
FIG. 3 is a cross-sectional variation of FIG. 2.

Bushing 16 and coaxial cable 12 are contained within tube 19. Tube 19 is a conductive material such as brass. Bushing 16 is made of a non-conductive material such as nylon and has at one end an enlarged diameter 28. Compression spring 15 is contained between end cap 17 and bushing 16. At one end tube 19 is coined into a groove 25 in end cap 17 which holds the end cap in position and confines one end of the compression spring 15 in place. When at rest, the bushing 16 is held in by the enlarged diameter 28 of bushing 16 is held in by the enlarged diameter 28 of bushing 16 and the shoulder 24 of tube 19 under the urging of the compression spring 15. Bushing 16 acts as a guide for coaxial cable 12. It prevents any lateral movement when the cable moves within tube 19. Chip resistor 26 in FIG. 2 and 3 terminates contact point 18 to outer shield 9 which prevents an open circuit between shield 9 and contact point 18. In FIG. 3 a conductive sleeve 37 which is normally made of brass is fastened to outer shield 9 at solder 39. A conductive compression spring 38 which is normally made of beryllium copper is fastened to sleeve 37 at solder 40. Sleeve 41 is a non-conductive material such as nylon and is used to isolate contact point 18 from sleeve 37. Compression spring 38 provides a ground return through shield 9 of coaxial cable 12.

Figure 4:
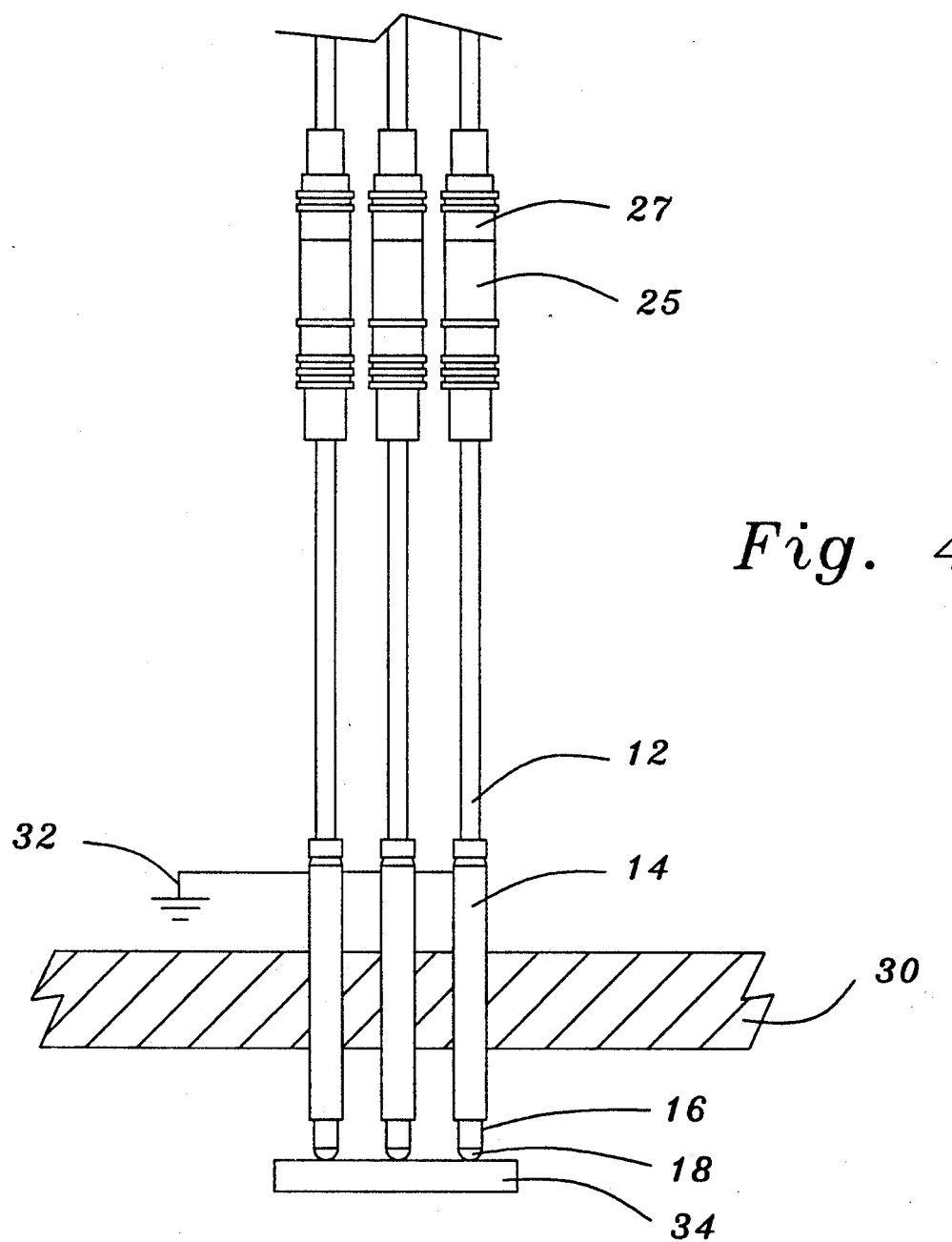
FIG. 4 is a vertical section through a probe block showing a number of probes of FIG. 1 coupled to the block for testing electronic parts.

A plurality of coaxial spring contact probes 14 are contained within a holding block 30, FIG. 4. Block 30 moves vertical up/down making contact with electronic device 34. When contact point 18 makes contact with device 34, coaxial cable 12 and bushing 16 moves within tube 19 thereby collapsing spring 15. This equal and opposite force allows contact point 18 to exert pressure on device 34. After a predetermined movement of the block 30 an electrical signal generated by the tester travels through wire 10 into electronic device 34. In FIG. 3 it shows one end of coaxial cable 12 terminated to a coaxial connector 25. The coaxial connector then mates with coaxial connector 27 which coaxial cable originated at the tester. Each coaxial probe 14 are tied together and are terminated to a ground 32. This configuration allows the matching of impedance between coaxial spring contact probe 14 with the tester and eliminates crosstalk between adjacent spring contact probes.

We claim:

1. An electrical circuit test spring probe comprising:
   an electrically conductive member having a predetermined impedance and having an inner conductor and an outer conductor;
   a contact head having a generally rounded contact surface and fastened to the inner conductor of said electrically conductive member;
   an electrically conductive housing;
   a non-conductive bushing slidably mounted within and spring loaded to the housing, said bushing surrounding said conductive member and being fastened to the contact head;
   means for electrically connecting the housing to the outer conductor of the electrically conductive member.

2. A probe as set forth in claim 1, wherein the electrically conductive member having a predetermined impedance includes an electrically conductive center wire, a non-conductive material surrounding the center wire, an electrically conductive layer surrounding the non-conductive material, and a non-conductive material surrounding the conductive layer.

3. A probe as set forth in claim 1, wherein the housing comprises a tube of electrically conductive material.

4. A probe as set forth in claim 1, wherein an end cap of electrically conductive material surrounds the electrically conductive member and closes one end of said housing.

5. A probe as set forth in claim 1, wherein a slidable bushing of a non-conductive material surrounds a the electrically conductive member and moves within said outer tube.

6. A probe as set forth in claim 1, wherein said means for electrically connecting the housing to the outer conductor comprises an electrically conductive compression spring, and wherein the bushing is spring loaded to the housing by said electrically conductive compression spring which is contained within said housing and surrounds said electrically conductive member and which is fastened at one end to the outer conductor of the electrically conductive member.

7. A probe as set forth in claim 6, wherein a compression spring when compressed will apply a bias force.

8. A probe as set forth in claim 1, further comprising a resistor connected between said contact head and said outer conductor of the electrically conductive member at the opposite end.

9. A probe as set forth in claim 6, wherein said compression spring of electrically conductive material is fastened to the outer conductor of the electrically conductive member.

10. An electrical circuit test spring probe comprising:
    an electrically conductive housing;
    a non-conductive bushing slidably mounted within the housing;
    a coaxial cable having an electrically conductive center conductor and an electrically conductive outer conductor,
    an electrically conductive contact head having a generally rounded contact surface, connected to said electrically conductive center conductor and fastened to the non-conductive bushing;
    a spring having a first end which is fastened to the housing and a second end which is fastened to the slidably mounted bushing such that the slidably mounted bushing and the contact head are urged outward from the housing.

* * * * *